United States Patent [19]

Nix

[11] Patent Number: 4,918,332

[45] Date of Patent: Apr. 17, 1990

[54] TTL OUTPUT DRIVER GATE CONFIGURATION

[75] Inventor: Michael A. Nix, Austin, Tex.

[73] Assignee: Advanced Micro Devices, Inc., Sunnyvale, Calif.

[21] Appl. No.: 206,761

[22] Filed: Jun. 15, 1988

[51] Int. Cl.[4] .................. H03K 3/01; H03K 17/16; H03K 19/094

[52] U.S. Cl. .................. 307/270; 357/23.14; 307/443; 307/450; 307/451; 307/546; 307/263; 307/572

[58] Field of Search ............ 307/270, 443, 448, 451, 307/546, 263, 572, 520; 357/23.14

[56] References Cited

U.S. PATENT DOCUMENTS 4,602,170 7/1986 Bertin .................. 307/450
4,771,195 9/1988 Stein .................. 307/443

Primary Examiner—John S. Heyman
Assistant Examiner—M. Wambach
Attorney, Agent, or Firm—Davis Chin

[57] ABSTRACT

A TTL output driver gate configuration which has reduced voltage spikes on internal power supply potential and ground potential nodes includes a P-channel pull-up transistor (P1), an N-channel pull-down transistor (N1), a NAND logic gate (14), a NOR logic gate (16), a first positive feedback amplifier circuit (18), and a second positive feedback amplifier circuit (20). The pull-up transistor (P1) and the pull-down transistor (N1) have gates which are made serpentine. The reduction of voltage spikes is achieved by slowing down the turn-on times of the pull-up and pull-down transistors during transitions due to the distributed resistances and capacitances of the polysilicon material used to form the serpentine gates thereof. The first and second positive feedback amplifier circuits (18, 20) are used to pull the undriven gate ends of the respective transistors all the way to negative and positive supply potentials so as to facilitate transitions at an output node.

20 Claims, 1 Drawing Sheet

TTL OUTPUT DRIVER GATE CONFIGURATION

BACKGROUND OF THE INVENTION

This invention relates generally to CMOS integrated circuits and more particularly, it relates to a TTL output driver gate configuration which has reduced voltage spikes on internal power supply potential and ground potential nodes.

In common practice, it is often required to use more than a single circuit type or logic type in an electrical system. For example, a complementary metal-oxide-semiconductor (CMOS) central processing unit may interface through busses with peripheral units adapted to receive transistor-transistor-logic (TTL) levels. Thus, there has been provided heretofore output buffer circuits which enable integrated circuits to receive CMOS input logic levels and to provide output signals that are TTL compatible. The output buffer circuit generates, when enabled, an output signal which is a function of a data signal received from other logic circuitry of the integrated circuit.

Output buffer circuits typically use a pull-up transistor device and a pull-down transistor device connected in series between first and second power supply terminals. The first power supply terminal may be supplied with a positive potential +V, which is connected to an internal power supply potential node. A second power supply terminal may be supplied with a negative potential −V or a ground potential, which is connected to an internal ground potential node. The connection point of the pull-up and pull-down transistor devices is further joined to an output terminal or pad.

Dependent upon the logic state of the data input signal and an enable signal, either the pull-up or pull-down transistor device is quickly turned ON and the other one of them is turned OFF. Such rapid switching ON and OFF of the pull-up and pull-down transistor devices causes sudden surges of current (di/dt or current spikes) in the power supply and ground lines due to parasitic packaging and interconnect inductance and resistance. Also, during output switching, charging and discharging currents from the pull-up and pull-down transistors driving large capacitive loads exists. These transient currents (current surges and charging/discharging currents) will flow through the inductive and resistive components of the power supply and ground lines so as to cause voltage spikes at the internal power supply potential and the internal ground potential nodes of the output buffer.

These voltage spikes are undesirable since they will degrade the output logic "1" and logic "0" voltage levels causing interfacing problems among the output buffer circuit and other integrated circuits. These undesirable voltage spikes at the internal power supply potential and ground potential nodes are sometimes referred to as "ground bounce." The "ground bounce" will be more severe when many output buffers are switched simultaneously to the same logic state, are operated at higher speeds, or are used to drive larger external capacitance loads. Under such circumstances, the voltage spike may be large enough to cause input buffers to change logic state and output buffers attempting to drive a logic "0" to go to a higher voltage level, thereby resulting in an erroneous operation.

In the design of output buffers, a trade-off is known to exist between achieving high-speed/high-drive operation and minimizing of the transient currents. While there have been attempts made in the prior art of output buffer design to achieve higher speed and higher output drive currents by increasing the sizes of the output pull-up and pull-down transistor devices, this has resulted in the disadvantage of increasing the voltage spikes. In other words, in order to minimize the voltage spikes for the prior art output buffer designs, the high-speed and/or high-drive characteristics was required to be sacrificed.

It would therefore be desirable to provide a TTL output driver gate configuration which has reduced voltage spikes on internal power supply potential and ground potential nodes with only a small speed penalty. The output driver gate configuration of the present invention includes a pull-up transistor and a pull-down transistor whose gates are made serpentine and are driven at only end thereof. The reduction of voltage spikes is achieved by slowing down the turn-on times of the pull-up and pull-down transistors during transistions by means of the distributed resistances and capacitances of the polysilicon material used to form the gates thereof.

SUMMARY OF THE INVENTION

Accordingly, it is a general object of the present invention to provide a TTL output driver gate configuration which is relatively simple and economical to manufacture and assemble, but yet overcomes the disadvantages of the prior art.

It is an object of the present invention to provide a TTL output driver gate configuration which has reduced voltage spikes on internal power supply potential and ground potential nodes with only a small speed penalty.

It is another object of the present invention to provide a TTL output driver gate configuration which is formed of a pull-up transistor and a pull-down transistor whose gates are made serpentine and are driven at only one end thereof.

It is still another object of the present invention to provide a TTL output driver gate configuration which includes a pull-up transistor, a pull-down transistor, a first positive feedback amplifier circuit, and a second positive feedback amplifier circuit.

In accordance with these aims and objectives, the present invention is concerned with the provision of a TTL output driver gate configuration which has reduced voltage spikes on internal power supply potential and ground potential nodes which includes a P-channel pull-up transistor, and an N-channel pull-down transistor, a first logic gate, a second logic gate, a first feedback amplifier circuit, and a second feedback amplifier circuit. The P-channel transistor has a serpentine gate with a first end and a second end, a source coupled to a positive potential via the internal power supply potential node, and its drain coupled to an output node. The N-channel transistor has a serpentine gate with a first end and a second end, a source coupled to a negative potential via the internal ground potential node, and a drain coupled to the output node. The first logic gate is responsive to a data input signal making a low-to-high transition for generating a first control signal which is connected to the first gate end of the pull-up transistor. The second logic gate is responsive to the data input signal making a high-to-low transition for generating a second control signal which is connected to the first gate end of the pull-down transistor.

The first positive feedback amplifier circuit is connected between the first and second gate ends of the pull-up transistor and is responsive to the first control signal for pulling down the second gate end of the pull-up transistor all the way to the negative potential so as to facilitate a low-to-high logic transition at the output node. The second positive feedback amplifier circuit is connected between the first and second gate ends of the pull-down transistor and is responsive to the second control signal for pulling up the second gate end of the pull-down transistor all the way to the positive potential so as to facilitate a high-to-low logic transition at the output node. The distributed R-C of the serpentine gates slow down the turn-on times of the pull-up and pull-down transistors so as to reduce voltage spikes at the internal power supply potential and ground potential nodes during transitions at th eoutput node.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
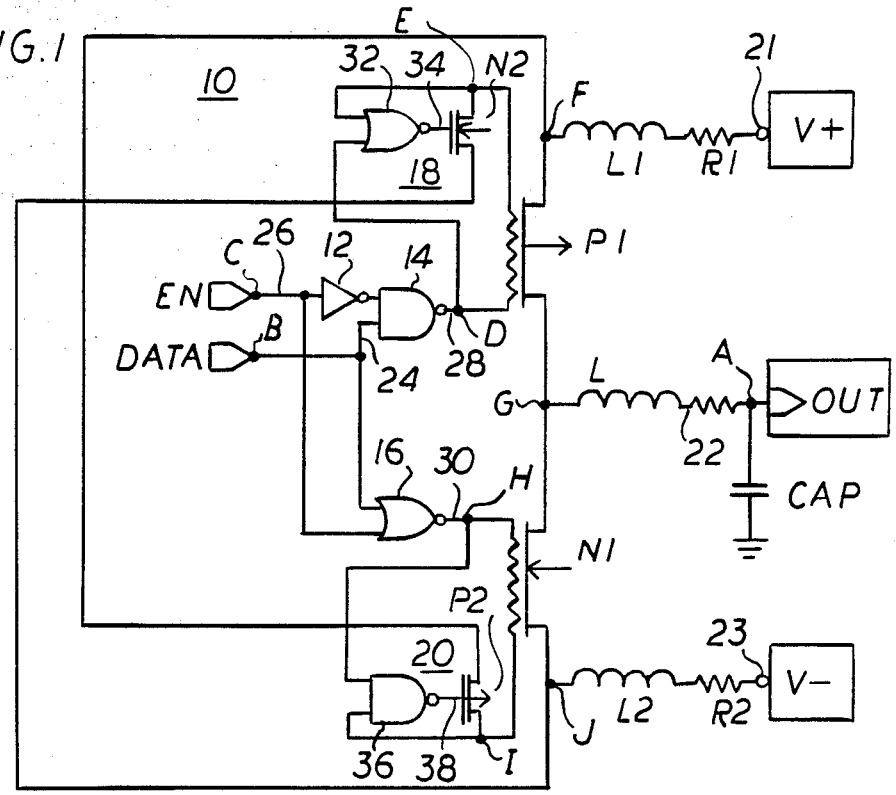
FIG. 1 is a schematic circuit diagram of a TTL output driver gate configuration, constructed in accordance with the principles of the present invention.

Referring now in detail to the drawings, there is shown in FIG. 1 a schematic circuit diagram of a TTL output driver gate configuration 10 of the present invention. The gate configuration 10 is formed of P-channel pull-up field-effect transistor (FET) P1 and an N-channel pull-down FET N1. Each of the transistors P1 and N1 is formed with a serpentine gate which is made of a polysilicon material. The polysilicon gate provides a distributed combination of resistances and capacitances which facilitates the slowing down of the turn-on times of the transistors as will be more fully explained hereinafter. The gate configuration 10 provides an output signal at an output node A in response to a data input signal DATA received at a data input node B and an enable signal EN received at an enable input node C.

The gate configuration 10 further includes an inverter 12, a NAND logic gate 14, a NOR logic gate 16, a first positive feedback amplifier circuit 18, and a second positive feedback amplifier circuit 20. Power for all of the components of the gate configuration 10 is provided by first external and second external power supply terminals 21, 23. A positive supply voltage or potential +V is applied to the first power supply terminal 21, and a negative power supply voltage or potential −V or ground potential is applied at the second power supply terminal 23. Typically, the positive supply voltage +V is made to be approximately +5.0 volts. The negative power supply voltage −V is made to be zero volts.

The gate configuration 10 is used to drive the output node A, which has a capacitive load CAP connected thereto, through a line 22 having parasitic inductance L. The NAND logic gate 14 receives the data input signal DATA on line 24 on its one input and the enable signal EN on line 26 via the inverter 12 on its other input. The output of the NAND logic gate 14 on line 28 is applied to a node D defining the driven end of the serpentine gate of the transistor P1. The opposite or undriven end of the serpentine gate of the transistor P1 is defined by node E. The transistor P1 has its source connected to an internal power supply potential node F and its drain connected to a common node G. The internal power supply potential node F is connected to the first external power supply terminal 21 via a series-connected resistor R1 and inductor L1, which represent the resistive and inductive components in the power supply line.

The NOR logic gate 16 receives the same data input signal DATA on the line 24 on its one input and the same enable signal EN on the line 26 on its other input. The output of the NOR logic gate 16 on line 30 is supplied to a node H defining the driven end of the serpentine gate of the transistor N1. The opposite or undriven end of the serpentine gate of the transistor N1 is defined by a node I. The transistor N1 has its source connected to an internal ground potential node J and its drain connected to the common node G. The internal ground potential node J is connected to the second external power supply terminal via a series-connected resistor R2 and inductor L2, which represent the resistive and inductive components in the ground line.

The first feedback amplifier circuit 18 is formed of a NOR logic gate 32 and an N-channel transistor N2. The NOR logic gate 32 has its one input connected to the output of the NAND logic gate 14 on the line 28 (node D) and its other input connected to the node E or undriven end of the P-channel serpentine gate. The output of line 34 of the NOR logic gate 32 is connected to the gate of the N-channel transistor N2. The transistor N2 has its source connected to the internal ground potential node J and its drain connected to the node E.

Similarly, the second feedback amplifier circuit 20 is formed of a NAND logic gate 36 and a P-channel transistor P2. The NAND logic gate 36 has its one input connected to the output of the NOR logic gate 16 on the line 30 (node H) and its other input connected to the node I or undriven end of the N-channel serpentine gate. The output on line 38 of the NAND logic gate 36 is connected to the gate of the P-channel transistor P2. The transistor P2 has its source connected to the internal power supply potential node F and its drain connected to the node I.

When the enable signal EN is at the high or logic "1" level, the output of the inverter 12 will be at the low or logic "0" level causing the output of the NAND logic gate 14 to be at the high logic level. As a result, the pull-up transistor P1 will be turned off. Further, the output of the NOR logic gate 16 will be at low logic level which turns off also the pull-down transistor N1. This produces a high impedance tri-state mode at the common node G in which the gate configuration 10 is not enabled. Thus, for normal operation the enable signal EN must be at a low or logic "0" level.

In order to provide an understanding of the normal operation of the output driver gate configuration 10 of the present invention, reference is now made to FIGS. 2(a)-2(f) of the drawings which illustrate the waveforms appearing at various points in the gate configuration of FIG. 1. Initially, it is assumed that the enable signal EN is at the low logic level and that the data input signal DATA is also at the low logic level. Further, it is assumed that the transistors N1 and P2 are both turned on and that the transistors P1 and N2 are both turned off. As a result, the output node A will be at a low logic level.

Figure 2:
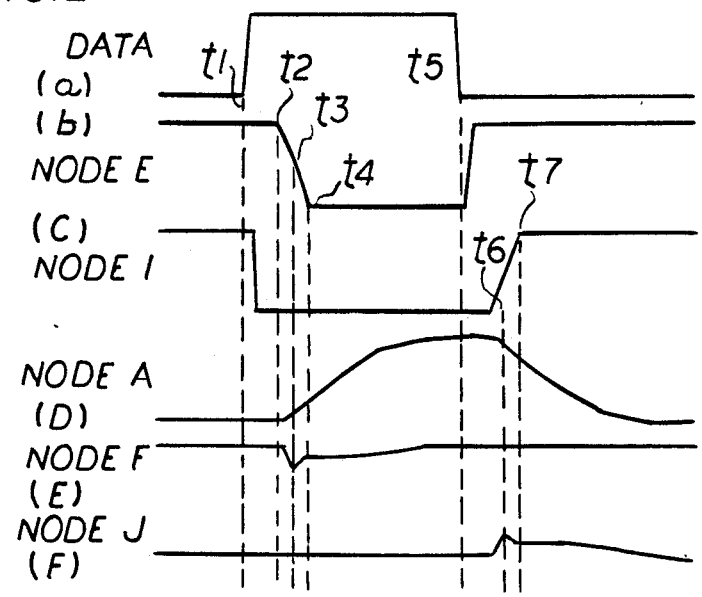
FIGS. 2(a)-2(f) are waveforms at various points in the circuit of FIG. 1, which are useful in understanding the operation thereof.

When the data input signal DATA makes a low-to-high transition at time t1, as shown in FIG. 2(a), the output of the NOR logic gate 16 on the line 30 will quickly make a high-to-low transition so as to turn off the driven gate end of the transistor N1. Further, the output of the NAND logic gate 36 on the line 38 will quickly make a low-to-high transition so as to turn off the transistor P2 in response to the change at the output of the NOR gate 16. This in turn causes the undriven end (node I) of the pull-down transistor N1 to be turned off. Simultaneously, the output of the NAND logic gate 14 on the line 28 defining a control signal will quickly make a high-to-low transition so as to turn on the driven gate end (node D) of the pull-down transistor P1.

However, due to the distributed resistances and capacitances of the polysilicon gate of the transistor P1, the pull-up transistor P1 will be slowed down in its turn-on time which reduces the current spikes (di/dt) appearing at the internal power supply potential node F. The waveform at the node F is illustrated in FIG. 2(e). At the time t2, the node E will still be at the high logic level and thus, the output of the NOR logic gate 32 will be maintained at the low logic level. The waveform at the node E is shown in FIG. 2(b). At the time t3, the low level at the node D will have propagated through the R-C delay of the serpentine gate and will reach the undriven gate end at the node E, which has the effect of pulling down the node E to about one-half down to the negative supply potential $-V$. As a consequence, the output of the NOR logic gate 32 will make a low-to-high transition so as to cause the transistor N2 to turn on.

This will, in turn, cause the node E at the time t4 to be pulled down all the way to the negative supply potential $-V$, which is coupled to the node J. Therefore, the pull-up transistor P1 will be turned on harder so as to allow the output node A to quickly reach the full positive supply potential $+V$ or high logic level. The waveform at the output node A is illustrated in FIG. 2(d).

When the data input signal DATA makes a high-to-low transition at the time t5, the output of the NAND logic gate 14 on the line 28 will quickly make a low-to-high transition so as to turn off the undriven gate end of the transistor P1. Further, in response to the change at the output of the NAND gate 14, the output of the NOR logic gate 32 on the line 34 will quickly make a high-to-low transition so as to turn off the transistor N2. This in turn causes the undriven gate end (node E) of the transistor P1 to be turned off. Simultaneously, the output of the NOR logic gate 16 will quickly make a low-to-high transition so as to turn on the driven gate end (node H) of the pull-down transistor N1.

However, due to the distributed resistances and capacitances of the polysilicon gate of the transistor N1, the pull-down transistor N1 will be slowed down in its turn-on time which reduces the current spikes (di/dt) appearing at the internal ground node J, as is illustrated in FIG. 2(f). At the time t6, the node I will still be at the low logic level and thus the output of the NAND logic gate 36 will be maintained at the high logic level. At the time t7, the high level at the node H will have propagated through the R-C delay of the serpentine gate and will reach the undriven gate end at the node I, which has the effect of pulling up the node I to about one-half of the positive supply potential $+V$. As a result, the output of the NAND logic gate 36 will make a high-to-low transition so as to cause the transistor P2 to turn on.

This will, in turn, cause the node I at time t7 to be pulled all the way to the positive supply $+V$, which is coupled to the node F. The waveform at the node I is depicted in FIG. 2(c). Therefore, the pull-down transistor N1 will be turned on harder so as to allow the output node A, as shown in FIG. 2(d), to quickly reach the full negative supply potential $-V$ or low logic level.

From the foregoing detailed description, it can thus be seen that the present invention provides a TTL output driver gate configuration which has reduced voltage spikes on internal power supply potential and ground potential nodes. The driver gate configuration includes a pull-up transistor and a pull-down transistor whose gates are made serpentine so as to slow down the turn-on times thereof. Further, first and second positive feedback amplifiers are provided to facilitate pulling the undriven gate ends of the transistors all the way to the respective negative and positive power supply potentials.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A TTL output driver gate configuration which has reduced voltage spikes on internal power supply potential and ground potential nodes comprising:

a P-channel pull-up transistor (P1) having a serpentine gate, a source and a drain, said pull-up transistor (P1) having a source coupled to a positive potential via the internal power supply potential node and its drain coupled to an output node, said serpentine gate of said pull-up transistor (P1) being formed of a first end and a second end;

an N-channel pull-down transistor (N1) having a serpentine gate, a source and a drain, said pull-down transistor (N1) having its source coupled to a negative potential via the internal ground potential node and its drain coupled to the output node, said serpentine gate of said pull-down transistor (N1) being formed of a first end and a second end;

first logic means (14) responsive to a data input signal making a low-to-high transition for generating a first control signal which is connected to the first gate end of said pull-up transistor;

second logic means (16) responsive to the data input signal making a high-to-low transition for generating a second control signal which is connected to the first gate end of said pull-down transistor (N1);

first positive feedback amplifier means (18) connected between the first and second gate ends of said pull-up transistor (N1) and being responsive to the first control signal for pulling down the second gate end of said pull-up transistor (P1) all the way to the negative potential so as to facilitate a low-to-high logic transition at the output node; and second positive feedback amplifier means (20) connected between the first and second gate ends of said pull-down transistor (N1) and being responsive to the second control signal for pulling up the second end of said pull-down transistor all the way to the positive potential so as to facilitate a high-to-low logic transition at the output node, whereby distributed R-C of the serpentine gates slow down the turn-on times of said pull-up and pull-down transistors (P1, N1) so as to reduce voltage spikes at the internal power supply potential and ground potential nodes during transitions at the output node.

2. A driver gate configuration as claimed in claim 1, wherein said first logic means comprises a first NAND logic gate (14).

3. A driver gate configuration as claimed in claim 1, wherein said second logic means comprises a first NOR logic gate (16).

4. A driver gate configuration as claimed in claim 1, wherein said pull-down transistor (N1) is quickly turned off for generating the low-to-high transition at the output node and wherein said pull-up transistor (P1) is initially turned on slowly so as to reduce the voltage spikes at the internal power supply node.

5. A driver gate configuration as claimed in claim 1, wherein said pull-up transistor (P1) is quickly turned off for generating the high-to-low transition at the output node and wherein said pull-down transistor (N1) is initially turned on slowly so as to reduce the voltage spikes at the internal ground node.

6. A driver gate configuration as claimed in claim 1, wherein said first positive feedback amplifier means comprises a second NOR logic gate (32) and a second N-channel transistor (N2).

7. A driver gate configuration as claimed in claim 6, wherein said second NOR logic gate (32) has one of its inputs connected to the first gate end of said pull-up transistor (P1) and its other input connected to the second gate end of said pull-up transistor (P1), said second N-channel transistor (N2) having its gate connected to the output of said second NOR gate (32), its drain connected to the second gate end of said pull-up transistor (P1), and its source connected to the ground potential node.

8. A driver gate configuration as claimed in claim 1, wherein said second positive feedback amplifier means comprises a second NAND logic gate (36) and a second P-channel transistor (P2).

9. A driver gate configuration as claimed in claim 8, wherein said second NAND gate (38) has one of its inputs connected to the first gate end of said pull-down transistor (N1) and its other input connected to the second gate end of said pull-down transistor (N1), said second P-channel transistor (P2) having its gate connected to the output of said second NAND gate (36), its drain connected to the second gate end of said pull-down transistor (N1), and its source connected to the internal power supply potential node.

10. A TTL output driver gate configuration which has reduced voltage spikes on internal power supply potential and ground potential nodes comprising:

a P-channel pull-up transistor (P1) having a serpentine gate, a source and a drain, said pull-up transistor (P1) having a source coupled to a positive potential via the internal power supply potential node and its drain coupled to an output node, said serpentine gate of said pull-up transistor (P1) being formed of a first end and a second end;

an N-channel pull-down transistor (N1) having a serpentine gate, a source and a drain, said pull-down transistor (N1) having its source coupled to a negative potential via the internal ground potential node and its drain coupled to the output node, said serpentine gate of said pull-down transistor (N1) being formed of a first end and a second end;

a first NAND logic gate (14) responsive to a data input signal making a low-to-high transition for generating a first control signal which is connected to the first gate end of said pull-up transistor;

a first NOR logic gate (16) responsive to the data input signal making a high-to-low transition for generating a second control signal which is connected to the first gate end of said pull-down transistor (N1);

first positive feedback amplifier means (18) connected between the first and second gate ends of said pull-up transistor (N1) and being responsive to the first control signal for pulling down the second gate end of said pull-up transistor (P1) all the way to the negative potential so as to facilitate a low-to-high logic transition at the output node; and second positive feedback amplifier means (20) connected between the first and second gate ends of said pull-down transistor (N1) and being responsive to the second control signal for pulling up the second gate end of said pull-down transistor all the way to the positive potential so as to facilitate a high-to-low logic transition at the output node, whereby distributed R-C of the serpentine gates slow down the turn-on times of said pull-up and pull-down transistors (P1, N1) so as to reduce voltage spikes at the internal power supply potential and ground potential nodes during transitions at the output node.

11. A driver gate configuration as claimed in claim 10, wherein said pull-down transistor (N1) is quickly turned off for generating the low-to-high transition at the output node and wherein said pull-up transistor (P1) is initially turned on slowly so as to reduce the voltage spikes at the internal power supply node.

12. A driver gate configuration as claimed in claim 11, wherein said pull-up transistor (P1) is quickly turned off for generating the high-to-low transition at the output node and wherein said pull-down transistor (N1) is initially turned on slowly so as to reduce the voltage spikes at the internal ground node.

13. A driver gate configuration as claimed in claim 12, wherein said first positive feedback amplifier means comprises a second NOR logic gate (32) and a second N-channel transistor (N2).

14. A driver gate configuration as claimed in claim 13, wherein said second NOR logic gate (32) has one of its inputs connected to the first gate end of said pull-up transistor (P1) and its other input connected to the second gate end of said pull-up transistor (P1), said second N-channel transistor (N2) having its gate connected to the output of said second NOR gate (32), its drain connected to the second gate end of said pull-up transistor (P1), and its source connected to the ground potential node.

15. A driver gate configuration as claimed in claim 14, wherein said second positive feedback amplifier means comprises a second NAND logic gate (36) and a second P-channel transistor (P2).

16. A driver gate configuration as claimed in claim 15, wherein said second NAND gate (38) has one of its inputs connected to the first gate end of said pull-down transistor (N1) and its other input connected to the second gate end of said pull-down transistor (N1), said second P-channel transistor (P2) having its gate connected to the output of said second NAND gate (36), its drain connected to the second gate end of said pull-down transistor (N1), and its source connected to the internal power supply potential node.

17. A TTL output driver gate configuration which has reduced voltage spikes on an internal power supply potential node comprising:
   a P-channel pull-up transistor (P1) having a serpentine gate, a source and a drain, said pull-up transistor (P1) having its source coupled to a positive potential via the internal power supply potential node and its drain coupled to an output node, said serpentine gate of said pull-up transistor (P1) being formed of a first end and a second end;
   logic means responsive to a data input signal making a low-to-high transition for generating a control signal which is connected to the first gate end of said pull-up transistor (P1); and
   positive feedback amplifier means (18) connected between the first and second gate ends of said pull-up transistor (P1) and being responsive to the control signal for pulling down the second gate end of said pull-up transistor all the way to a negative supply potential so as to facilitate a low-to-high logic transition at the output node,
   whereby distributed R-C of the serpentine gate slows down the turn-on time of said pull-up transistor so as to reduce voltage spikes at the internal power supply potential node during transition at the output node.

18. A driver gate configuration as claimed in claim 17, wherein said logic means comprises a first NAND logic gate (14).

19. A driver gate configuration as claimed in claim 18, wherein said positive feedback amplifier means comprises a NOR logic gate (32) and an N-channel transistor (N2).

20. A driver gate configuration as claimed in claim 19, wherein said NOR logic gate (32) has one of its inputs connected to the first gate end of said pull-up transistor (P1) and its other input connected to the second gate end of said pull-up transistor (P1), said N-channel transistor (N2) having its gate connected to the output of said NOR gate (32), its drain connected to the second gate end of said pull-up transistor (P1), and its source connected to a ground potential node.

* * * * *